United States Patent
Li et al.

(10) Patent No.: US 9,633,702 B2
(45) Date of Patent: Apr. 25, 2017

(54) MEMORY SYSTEM WITH UNIFORM DECODER AND OPERATING METHOD OF SAME

(71) Applicant: Macronix International Co., Ltd., Hsinchu (TW)

(72) Inventors: Hsiang-Pang Li, Zhubei (TW); Kin-Chu Ho, Macau (CN)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/813,759

(22) Filed: Jul. 30, 2015

(65) Prior Publication Data

US 2017/0032826 A1     Feb. 2, 2017

(51) Int. Cl.
*G11C 7/10* (2006.01)
*G11C 7/06* (2006.01)

(52) U.S. Cl.
CPC ............... *G11C 7/062* (2013.01); *G11C 7/10* (2013.01)

(58) Field of Classification Search
USPC .................. 365/185.03, 189.05; 711/103
See application file for complete search history.

(56) References Cited

U.S. PATENT DOCUMENTS

| | | | | |
|---|---|---|---|---|
| 2011/0072191 A1* | 3/2011 | Huang | ........... | G11C 16/10 711/103 |
| 2013/0077404 A1* | 3/2013 | Nawata | ........... | G11C 16/10 365/185.17 |
| 2013/0136121 A1* | 5/2013 | Su | ........... | H04L 45/74 370/389 |

* cited by examiner

*Primary Examiner* — Anthan Tran
(74) *Attorney, Agent, or Firm* — Finnegan, Henderson, Farabow, Garrett & Dunner LLP (57) ABSTRACT

A memory system includes a memory array including a plurality of memory cells, and an encoder operatively coupled to the memory array, for encoding an original data element to be programmed into the memory cells into a uniform data element in which the number of "0"s approximately equals the number of "1"s.

12 Claims, 10 Drawing Sheets

MEMORY SYSTEM WITH UNIFORM DECODER AND OPERATING METHOD OF SAME

FIELD OF THE DISCLOSURE

The present disclosure relates to a memory system and operation method of the same and, more particularly, to a memory system having a uniform decoder.

BACKGROUND

A memory system includes a plurality of memory cells for storing data. The data stored in a memory cell is determined by a threshold voltage of the memory cell, which is the voltage at which the memory cell begins to conduct current. However, the threshold voltage of a memory cell may drift due to various reasons, such as program disturb, read disturb, temperature variation, and data retention. Such drifting may result in false reading of the data stored in the memory cells.

SUMMARY

According to an embodiment of the disclosure, a memory system includes a memory array including a plurality of memory cells, and an encoder, operatively coupled to the memory array, for encoding an original data element to be programmed into the memory cells into a uniform data element in which the number of "0"s approximately equals the number of "1"s.

According to another embodiment of the disclosure, a method for operating a memory system is provided. The method includes receiving an original data element to be programmed into a memory array including a plurality of memory cells, encoding the original data element into a uniform data element in which the number of "0"s equals or approximately equals the number of "1"s, and programming the uniform data element into the memory cells.

According to still another embodiment of the disclosure, a method for operating a memory system is provided. The memory system includes a memory array including a plurality of memory cells programmed with uniform data in which the number of "0"s equals, or approximately equals, the number of "1"s. The method includes sensing data programmed in a subset of memory cells in the memory array corresponding to a selected word line, and adjusting a word line level of the selected word line based on a comparison between the number of "0"s and the number of "1"s in the sensed data.

The accompanying drawings, which are incorporated in and constitute a part of this specification, illustrate disclosed embodiments and, together with the description, serve to explain the disclosed embodiments.

DETAILED DESCRIPTION

Reference will now be made in detail to the present embodiments, examples of which are illustrated in the accompanying drawings. Wherever possible, the same reference numbers will be used throughout the drawings to refer to the same or like parts.

Figure 1:
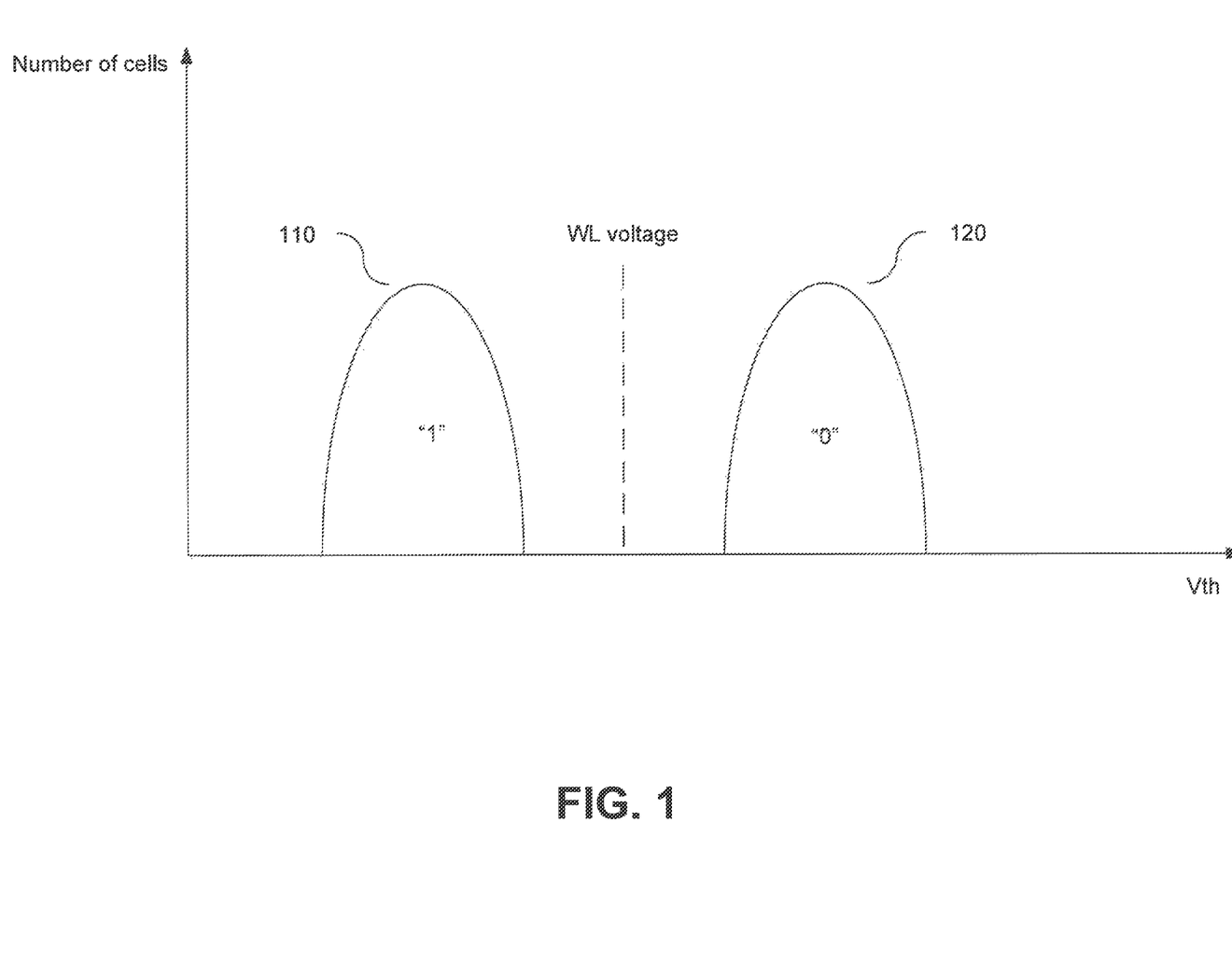
FIG. 1 schematically illustrates a threshold voltage distribution of a plurality of memory cells.

FIG. 1 schematically illustrates a threshold voltage (Vth) distribution of a plurality of memory cells. Curve 110 represents the number of memory cells having various Vths that correspond to data "1"; and curve 120 represents the number of memory cells having various Vths that correspond to data "0". In general, data stored in a memory cell is determined by its Vth, which is the voltage at which the memory cell begins to conduct current. The Vth of the memory cell can be modified by a program operation or an erase operation. To read the data stored in the memory cell, a read word-line (WL) voltage is applied to the gate of the memory cell. If the Vth of the memory cell is smaller than the WL voltage, a current flows through the memory cell, and the current is sensed by a sense amplifier. In such case, the data stored in the memory cell is "1". Otherwise, if the Vth of the memory cell is higher than the WL voltage, no current flows through the memory cell. In such case, the data stored in the memory cell is "0".

The Vth of a memory cell may drift due to program disturb, read disturb, temperature variation, or data retention. The drifting of Vth may occur across a plurality of memory cells. Such drifting results in drifting of the Vth distribution of the plurality of memory cells, and may lead to false reading of the data stored in the memory cells.

Figure 2:
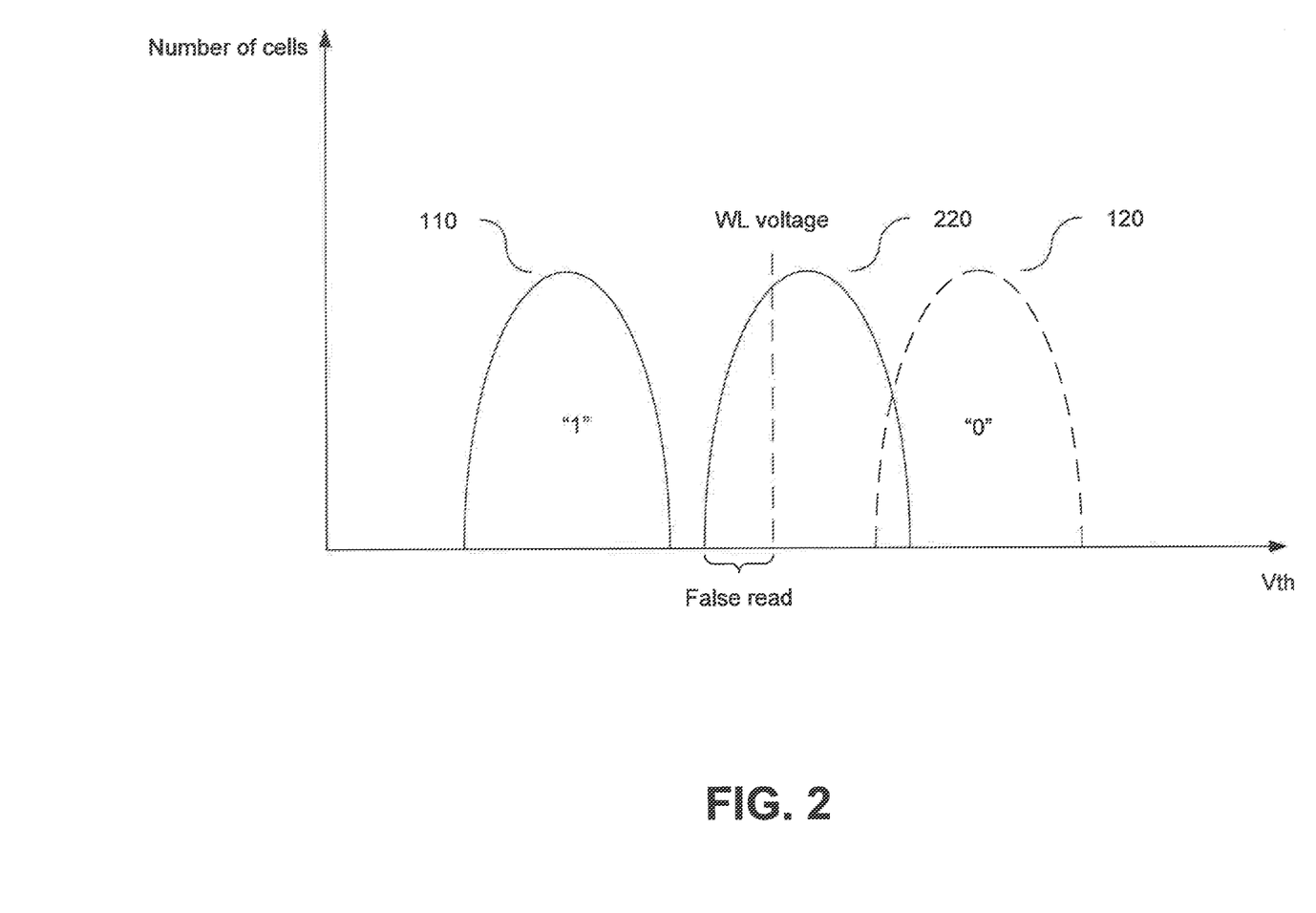
FIG. 2 schematically illustrates a threshold voltage distribution of a plurality of memory cells, after threshold voltage drifting.

FIG. 2 schematically illustrates a Vth distribution of a plurality of memory cells, after Vth drifting. As illustrated in FIG. 2, curve 120 drifts in the left direction and becomes curve 220. If the WL voltage illustrated in FIG. 1 is applied to the memory cells during a read operation, some memory cells that were originally programmed to store "0", but having Vths lower than the WL voltage, are falsely read as "1". One way to avoid falsely reading data stored in the memory cells is to apply an optimal WL voltage, which is located between curve 110 and curve 220, in order to correctly read data.

Figure 3:
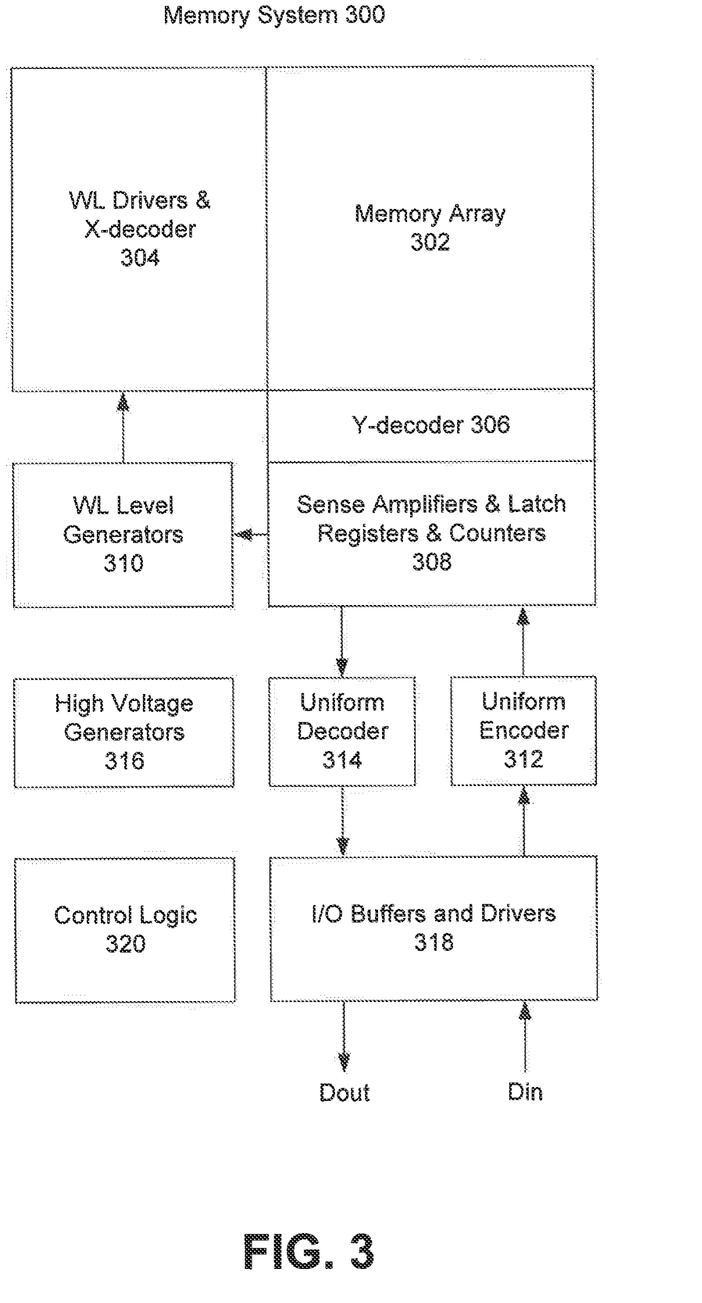
FIG. 3 is a block diagram of a memory system, according to an illustrated embodiment.

FIG. 3 is a block diagram of a memory system 300, according to an illustrated embodiment. As illustrated in FIG. 3, memory system 300 includes a memory array 302, a word line (WL) drivers and X-decoder block 304 operatively coupled to memory array 302, a Y-decoder block 306 operatively coupled to memory array 302, a sense amplifiers and latch registers and counters block 308 operatively coupled to Y-decoder block 306, a WL level generators block 310 operatively coupled to sense amplifiers and latch registers and counters block 308 and WL drivers and X-decoder block 304, a uniform encoder 312 operatively coupled to sense amplifiers and latch registers and counters block 308, a uniform decoder 314 operatively coupled to sense amplifiers and latch registers and counters block 308, a high voltage generators block 316, an I/O buffers and drivers block 318 operatively coupled to uniform encoder 312 and uniform decoder 314, and a control logic block 320.

In a program operation according to an embodiment, an original data element (Din) and a data address corresponding to a location in memory array 302, are input to I/O buffers and drivers block 318 for temporary storage. As used herein, the "original data element" refers to data input by a user or a host system, to be programmed/stored in memory array 302. The original data element is made up of n-bit of data. Uniform encoder 312 encodes the original data element into a uniform data element, in which the number of "0"s equals, or approximately equals, the number of "1"s. As used herein, "approximately equals" refers to the difference between the numbers of "0"s and "1"s being within a predetermined error range which is tolerable for memory system 300. A detailed description regarding the operation of uniform encoder 312 is provided below. Uniform encoder 312 transfers the uniform data element to sense amplifiers and latch registers and counters block 308, which determines bit-line (BL) voltage levels based on the uniform data element, and transfers the determined BL levels to Y-decoder block 306. WL level generators block 310 generates WL voltage levels, and transfers the generated WL voltage levels to the selected WL through WL drivers and X-decoder block 304 to memory array 302. Y-decoder block 306, which decodes the selected BL and applies the determined BL voltage level to memory array 302 based on the decoded address. As a result, the uniform data element is stored in a subset of memory cells of memory array 302.

In a read operation according to an embodiment, WL level generators block 310 generates a determined WL level first. Sense amplifiers and latch registers and counters block 308 senses the data stored in memory array 302, counts the numbers of "0"s and "1"s in the sensed data, and transfers the sensed data to uniform decoder 314 if the sensed data is uniform data in which the number of "0"s equals or approximately equals the number of "1"s. Uniform decoder 314 decodes the data, and transfers the decoded data to I/O buffers and drivers block 318, which then outputs the decoded data as output data (Dout). If the sensed data are not uniform data, WL level generators block 310 modifies the determined WL level based on the counter result generated by sense amplifiers and latch registers and counters block 308, and repeats sensing the data and counting the numbers of "0" and "1" in the sensed data. High voltage generators block 316 is activated for high voltage operations, such as, for example, power source of WL level and BL level under a program operation. Control logic block 320 controls the operation of the circuit blocks in memory system 300.

Various coding techniques may be employed by uniform encoder 312 to encode the original data element into the uniform data, in which the number of "0"s equals the number of "1"s. In one embodiment, uniform encoder 312 divides the original data element into a plurality of original data units, and applies a coding algorithm to encode each original data unit into a uniform data unit in which the number of "0"s equals the number of "1"s. As used herein, a "data unit" is a unit of data having plural bits, and the data element includes one or more data units. The data units have the same size. A data unit includes k bits of data, where k=m/l, m being the number of bits in a data element, and l being the number of data units in the data element. The original data element includes a plurality of original data units, and the uniform data element includes a plurality of uniform data units.

Figure 4:
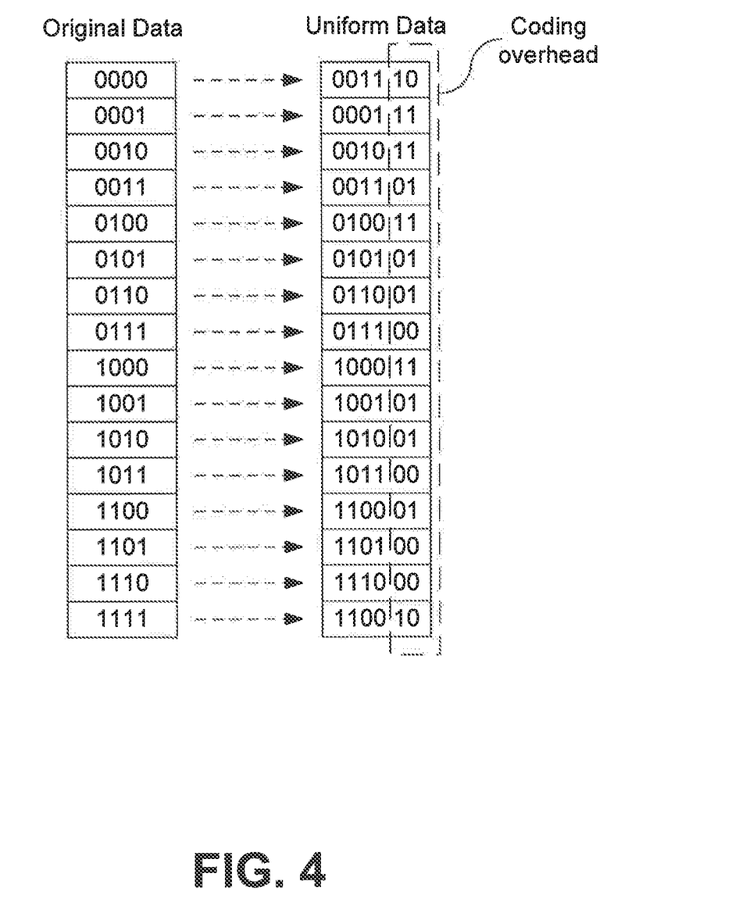
FIG. 4 illustrates an exemplary coding scheme for encoding 4-bit original data into 6-bit uniform data, according to an illustrated embodiment.

FIG. 4 illustrates an exemplary coding scheme for encoding a 4-bit original data unit into a 6-bit uniform data unit, according to an illustrated embodiment. In this example, except as noted below, uniform encoder 312 adds a 2-bit coding overhead to an end of the 4-bit original data unit to generate a 6-bit uniform data unit, based on numbers of "0"s and "1"s in the 4-bit original data unit. Specifically, first, uniform encoder 312 counts the number of "0"s and "1"s in the 4-bit original data unit. When the 4-bit original data unit contains one or two "0"s or "1"s, uniform encoder 312 adds a 2-bit coding overhead selected from "00", "01", and "11" to the 4-bit original data unit to generate the 6-bit uniform data unit, such that the number of "0"s in the 6-bit uniform data unit equals the number of "1"s. For example, when a 4-bit original data unit is "0001" which contains one "1" and three "0"s, uniform encoder 312 adds "11" to "0001" to generate "000111", which contains three "1"s and three "0"s. As another example, when a 4-bit original data unit is "1010" which contains two "1"s and two "0"s, uniform encoder 312 adds "01" to "1010" to generate "101001", which contains three "1"s and three "0"s. On the other hand, when a 4-bit original data unit contains four "0"s or four "1"s, uniform encoder 312 performs an additional operation of inverting the last two bits of the 4-bit original data unit to generate a 4-bit inverted data unit, and then adds a 2-bit coding overhead "10" to the 4-bit inverted data unit to generate a 6-bit uniform data unit. For example, when a 4-bit original data unit is "0000" which contains four "0"s, uniform encoder 312 inverts the last two bits of the "0000" to generate "0011", and then adds "10" to "0011" to generate "001110". As another example, when a 4-bit original data unit is "1111" which contains four "1"s, uniform encoder 312 inverts the last two bits of "1111" to generate "1100", and then adds "10" to "1100" to generate "110010".

In another embodiment, uniform encoder 312 applies a randomize operation to encode the original data element into the uniform data element. For example, uniform encoder 312 first generates a random seed, which can include 4 bits. Uniform encoder 312 then divides the original data element into a plurality of 4-bit original data units, and applies the randomize operation on each original data unit by using the random seed, to generate a 4-bit randomized data unit. Next, uniform encoder 312 adds a correction item, such as a 2-bit coding overhead, to the 4-bit randomized data unit, to balance the number of "0"s and "1"s.

In still another embodiment, uniform encoder 312 encodes each original data unit into a uniform data unit according to a lookup table. For example, the lookup table includes mapping relationships between a plurality of 4-bit original data units and a plurality of 6-bit uniform data units. FIG. 4 illustrates an exemplary lookup table. The lookup table can be pre-defined by a user, and can be stored in a non-volatile memory accessible by uniform encoder 312. The lookup table can be implemented by hardware or by software.

In the above described embodiment, the original data unit includes 4 bits, and the uniform data unit includes 6 bits, and the coding overhead includes 2 bits. However, the present embodiment is not limited thereto, and the original data unit can include k bits, the uniform data unit can include n bits, and the coding overhead can include (n-k) bits, where both k and n are positive even numbers, and n>k. For example, uniform encoder 312 can encode each 4-bit original data unit into an 6-bit uniform data unit, by adding a 2-bit coding overhead to the 4-bit original data unit. As another example, uniform encoder 312 can encode each 8-bit original data unit into a 12-bit uniform data unit, by adding a 4-bit coding overhead to the 8-bit original data unit. The numbers n and k can be predetermined by a user, based on the structure and the function of memory system 300, and the nature (e.g., the number of "0"s and "1"s, the size, etc.) of the original data element to be programmed into memory array 302.

Figure 5:
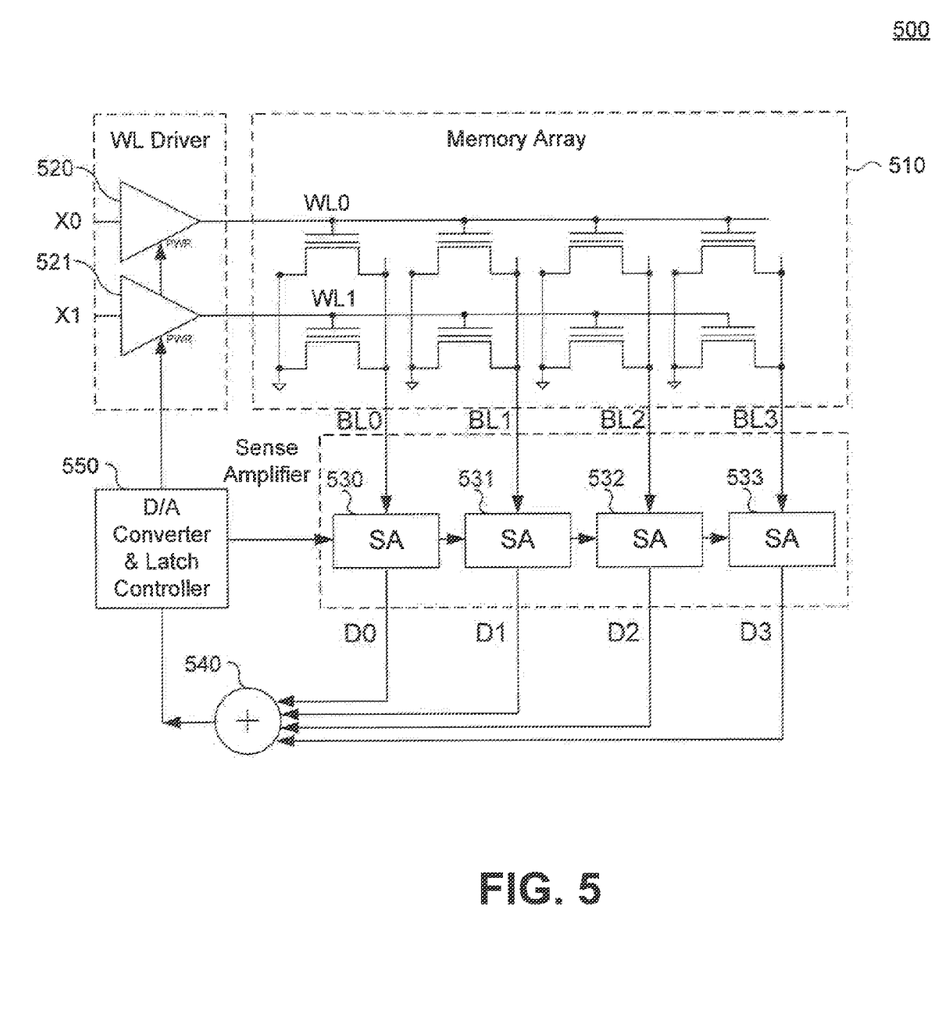
FIG. 5 illustrates a configuration of a read circuit for tracking an optimal read word-line voltage during a read operation, according to an illustrated embodiment.

In some embodiments, once the uniform data element is programmed into the memory array, the uniform data element can be utilized to track (i.e., find) the optimal WL voltage even when the Vths of memory cells have drifted. FIG. 5 illustrates a configuration of a read circuit 500 for tracking the optimal WL voltage during a read operation, according to such an embodiment. Read circuit 500 is a digital circuit which counts the numbers of "1"s and "0"s of the data in the memory array.

As illustrated in FIG. 5, circuit 500 includes a memory array 510, WL drivers 520 and 521, sense amplifiers (SAs) 530-533, a bit accumulator 540, and a digital-to-analog (D/A) converter and latch controller 550. Memory array 510 includes a plurality of memory cells arranged in rows and columns. Word lines WL0 and WL1 are arranged along the row direction of the memory cells. Bit lines BL0-BL3 are arranged along the column direction of the memory cells. The gates of each row of the memory cells are connected to a corresponding one of WL0 and WL1. The drain electrodes of each column of the memory cells are connected to a corresponding one of BL0-BL3. The source electrode of each memory cell is coupled to a reference voltage level, e.g., ground level. WL drivers 520 and 521 are operatively coupled to WL0 and WL1, to respectively supply WL voltages to WL0 and WL1. Sense amplifiers 530-533 are operatively coupled to BL0-BL3, respectively, and bit accumulator 540. Sense amplifiers 530-533 sense data respectively programmed in the memory cells corresponding to a selected word line (i.e., the word line that is selected to read), and transfer the sensed data D0-D3 to bit accumulator 540. For example, when WL0 is the selected word line to read, sense amplifiers 530-533 sense the data programmed in the memory cells corresponding to WL0. Bit accumulator 540 accumulates the data D0-D3 sensed by sense amplifiers 530-533, and transfers the accumulated data to D/A converter and latch controller 550. D/A converter and latch controller 550 is operatively coupled to bit accumulator 540, sense amplifiers 530-533, and WL drivers 520 and 521. D/A converter and latch controller 550 receives the data transferred from bit accumulator 540, generates an analog signal indicating an adjusted word line (WL) level of the selected word line, and transfers the analog signal to WL driver 520 or 521 corresponding to the selected word line. D/A converter and latch controller 550 adjusts the WL level of the selected word line, e.g., WL0, based on the accumulated data transferred from bit accumulator 540. For example, D/A converter and latch controller 550 raises the WL level if the number of "1"s in the sensed data is less than the number of "0"s, and lowers the WL level if the number of "1"s in the sensed data is more than the number of "0"s. After receiving the analog signal representing the adjusted WL level from D/A converter and latch controller 550, WL driver 520 or 521 supplies a WL voltage having the adjusted WL level to the selected word line. For example, when WL0 is the selected word line, D/A converter and latch controller 550 transfers the adjusted WL level to WL driver 520, which then supplies a WL voltage having the adjusted WL level to WL0. Although not illustrated in FIG. 5, sense amplifiers 530-533 are operatively connected to uniform decoder 314, which is operatively coupled to I/O buffer 318. When D/A converter and latch controller 550 determines, based on the accumulated data transferred from bit accumulator 540, that the number of "1"s in the sensed data equals, or approximately equals, the number of "0"s, D/A converter and latch controller 550 controls sense amplifiers 530-533 to latch the sensed data. As used herein, "approximately equals" refers to the difference between the numbers of "0"s and "1"s being within a predetermined error range which is tolerable by memory system 300. Sense amplifiers 530-533 then transfer the data to the uniform decoder, which decodes the data and transfers the decoded data to the I/O buffer.

Figure 6:
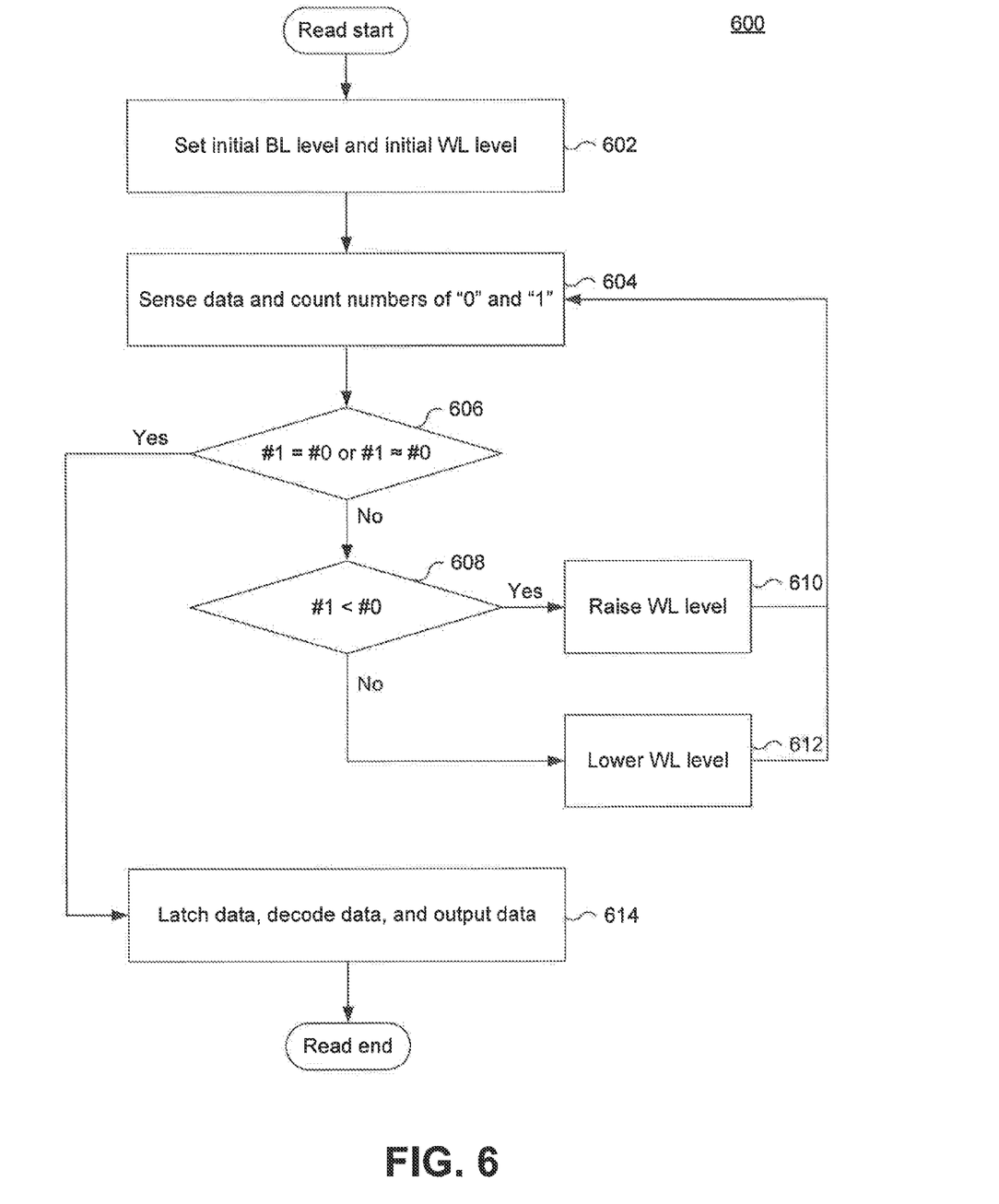
FIG. 6 is a flow chart of a process performed in the read circuit of FIG. 5 during a read operation, according to an illustrated embodiment.

FIG. 6 is a flow chart of a process 600 performed by read circuit 500 during a read operation, according to an illustrated embodiment. The read operation reads data programmed in memory cells corresponding to a selected word line, e.g., WL0. As illustrated in FIG. 6, when read circuit 500 receives a read instruction, read circuit 500 is initialized to set initial bit line (BL) levels to be applied to BL0-BL3, and to set initial word line (WL) levels to be applied to WL0 and WL1, where WL0 is the selected word line and WL1 is a non-selected word line (step 602). Read circuit 500 then applies BL voltages having the initial BL levels to BL0-BL3, and WL drivers 520 and 521 apply WL voltages having the initial WL levels to WL0 and WL1, respectively (step 602). In step 604, sense amplifiers 530-533 sense the data programmed in the memory cells coupled to WL0, and bit accumulator 540 accumulates the data sensed by sense amplifiers 530-533, and counts the numbers of "0"s and "1"s in the sensed data. Then, D/A converter and latch controller 550 determines whether the number of "0"s equals, or approximately equals (i.e., the difference between the numbers of "0"s and "1"s is within a predetermined error range), the number of "1"s (step 606). For example, D/A converter and latch controller 550 can determine whether the number of "1"s in the sensed data equals a predetermined number of "1"s, which represents the number of "1"s when the number of "0"s equals the number of "1"s. When the number of "1"s in the sensed data equals, or approximately equals with an acceptable error, the predetermined number of "1"s, D/A converter and latch controller 550 determines that the number of "0"s equals, or approximately equals, the number of "1"s. If the number of "0"s does not equal, nor approximately equal, the number of "1"s (step 606: No), D/A converter and latch controller 550 adjusts the WL level of WL0 based on the difference between the number of "1"s and the number of "0"s. Specifically, D/A converter and latch controller 550 determines whether the number of "1"s is less than the number of "0"s, and the difference between the numbers of "0"s and "1"s is beyond the predetermined error range (step 608). If the number of "1"s is less than the number of "0"s and the difference between the numbers of "0"s and "1"s is beyond the predetermined error range (step 608: Yes), D/A converter and latch controller 550 raises the WL level of WL0 by an amount determined based on the difference between the number of "1"s and the number of "0"s (step 610). Otherwise, if the number of "1"s is not less than, i.e., more than, the number of "0"s and the difference between the numbers of "0"s and "1"s is beyond the predetermined error range (step 608: No), D/A converter and latch controller 550 lowers the WL level of WL0 by an amount determined based on the difference between the number of "1"s and the number of "0"s (step 612). After either one of step 610 or 612, process 600 returns to step 604 in which WL driver 520 applies a WL voltage having the adjusted, i.e., raised or lowered, WL level to WL0 to sense the data programmed in the memory cells corresponding to WL0, and bit accumulator 540 accumulates the data sensed by sense amplifiers 530-533, and counts the numbers of "0"s and "1"s in the sensed data. If the number of "0"s equals, or approximately equals, the number of "1"s (step 606: Yes), sense amplifiers 530-533 latches the data read from the plurality of memory cells, uniform decoder 314 decodes the latched data, and then outputs the data (step 614). After step 614, process 600 ends. After process 600, a similar process may be performed to read data programmed in memory cells corresponding to WL1.

Figure 7:
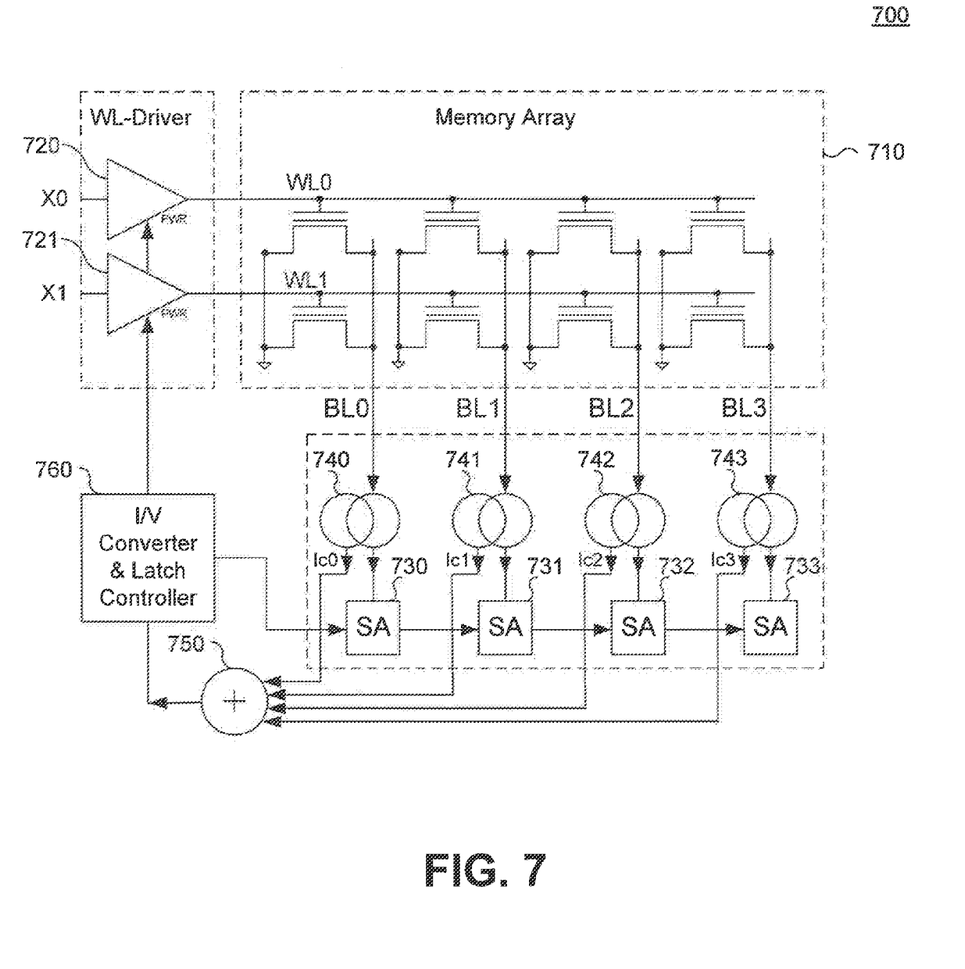
FIG. 7 illustrates a configuration of a read circuit for tracking an optimal read word-line voltage during a read operation, according to an illustrated embodiment.

FIG. 7 illustrates a configuration of a read circuit 700 for tracking the optimal WL voltage during a read operation, according to an illustrated embodiment. Read circuit 700 is an analog circuit which senses the current output by the memory array.

As illustrated in FIG. 7, circuit 700 includes a memory array 710, WL drivers 720 and 721, sense amplifiers (SAs) 730-733, current transformers 740-743, a current accumulator 750, and a current/voltage (I/V) converter and latch controller 760. Memory array 710 includes a plurality of memory cells arranged in rows and columns. Word lines WL0 and WL1 are arranged along the row direction of the memory cells. Bit lines BL0-BL3 are arranged along the column direction of the memory cells. WL drivers 720 and 721 are operatively coupled to WL0 and WL1 of memory array 710, to respectively supply WL voltages to WL0 and WL1. Sense amplifiers 730-733 are respectively and operatively coupled to BL0-BL3 of memory array 710, to sense the currents respectively flowing in BL0-BL3. Current transformers 740-743 are operatively coupled to BL0-BL3 of memory array 710, to provide currents Ic0-Ic3 representative of the currents respectively flowing in BL0-BL3, and transfer the representative currents Ic0-Ic3 to current accumulator 750. Each of current transformers 740-743 can be implemented by a current mirror. Current accumulator 750 is operatively coupled to current transformers 740-743 and I/V converter and latch controller 760, to accumulate the currents Ic0-Ic3 provided by current transformers 740-743, and transfer the accumulated current to I/V converter and latch controller 760. I/V converter and latch controller 760 is operatively coupled to current accumulator 750, sense amplifiers 730-733, and WL drivers 720 and 721. I/V converter and latch controller 760 adjusts a word line (WL) level of the selected word line, e.g., WL0, based on the accumulated current. For example, I/V converter and latch controller 760 raises the WL level if the accumulated current is lower than a predetermined current representing an accumulated current when the number of "1"s equals the number of "0"s; and lowers the WL level if the accumulated current is higher than the predetermined current. I/V converter and latch controller 760 transfers a voltage signal representing the adjusted WL level to WL driver 520 or 521, which then supplies a WL voltage having the adjusted WL level to the selected word line. For example, when WL0 is the selected word line, I/V converter and latch controller 760 transfers the adjusted WL level to WL driver 720, which then supplies a WL voltage having the adjusted WL level to WL0. Although not illustrated in FIG. 7, sense amplifiers 730-733 are operatively coupled to uniform decoder 314, which is operatively coupled to I/O buffer 318. When the accumulated current equals or approximately equals the predetermined current, I/V converter and latch controller 760 controls sense amplifiers 730-733 to latch the sensed currents, convert the sensed currents into data, and transfer the data to the uniform decoder 314, which decodes the data and transfers the decoded data to the I/O buffer 318.

Figure 8:
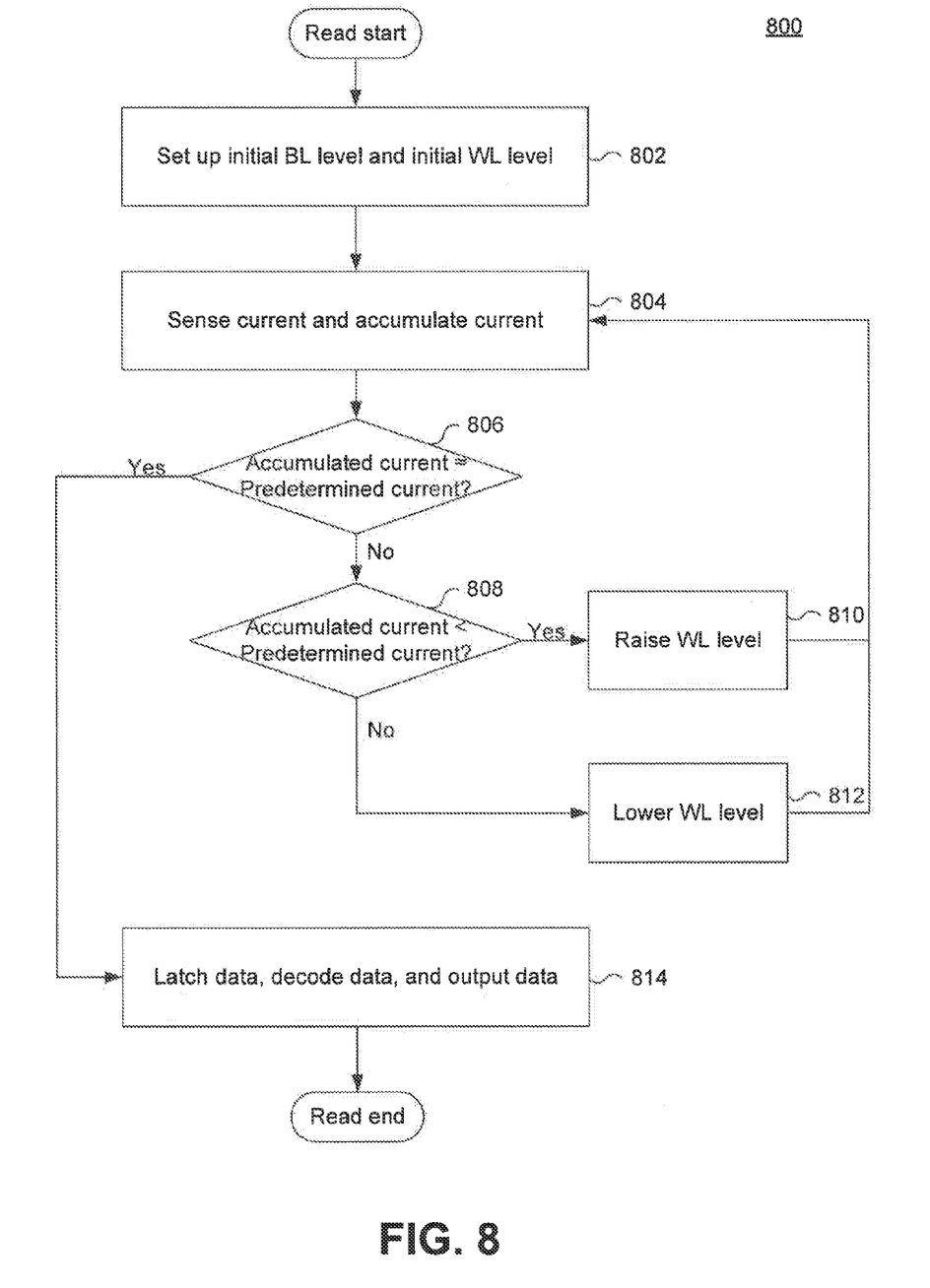
FIG. 8 is a flow chart of a process performed in the read circuit of FIG. 7 during a read operation, according to an illustrated embodiment.

FIG. 8 is a flow chart of a process 800 performed in read circuit 700 during a read operation, according to an illustrated embodiment. As illustrated in FIG. 8, when read circuit 700 receives a read instruction, read circuit 700 is initialized to set initial bit line (BL) levels to be applied to BL0-BL3, and to set initial word line (WL) levels to be applied to WL0 and WL1, where WL0 is the selected word line (step 802). Read circuit 700 then applies BL voltages having the initial BL levels to BL0-BL3, and WL drivers 720 and 721 apply WL voltages having the initial WL levels to WL0 and WL1, respectively (step 802). In addition, in step 804, sense amplifiers 730-733 sense the currents respectively flowing in BL0-BL3. Current transformers 740-743 provide currents Ic0-Ic3 representative of the currents flowing in BL0-BL3, respectively, and provide the representative currents to current accumulator 750. Current accumulator 750 accumulates the currents Ic0-Ic3 provided by current transformers 740-743. Then, I/V converter and latch controller 760 determines whether the accumulated current equals, or approximately equals, a predetermined current (i.e., the difference between the accumulated current and the predetermined current is within a predetermined error range) (step 806). As discussed previously, the predetermined current represents an accumulated current when the number of "1"s in the data programmed in the memory cells corresponding to the selected word line, equals the number of "0"s. If the accumulated current does not equal, nor approximately equal, the predetermined current (step 806: No), I/V converter and latch controller 760 adjusts the WL level of WL0 based on the difference between the accumulated current and the predetermined current. Specifically, I/V converter and latch controller 760 determines whether the accumulated current is less than the predetermined current and the difference between the accumulated current and the predetermined current is beyond the predetermined error range (step 808). If the accumulated current is less than the predetermined current and the difference between the accumulated current and the predetermined current is beyond the predetermined error range (step 808: Yes), I/V converter and latch controller 760 raises the WL level of WL0 by an amount determined based on the difference between the accumulated current and the predetermined current (step 810). Otherwise, if the accumulated current is not less than, i.e., is higher than, the predetermined current and the difference between the accumulated current and the predetermined current is beyond the predetermined error range (step 808: No), I/V converter and latch controller 760 lowers the WL level of WL0 by an amount determined based on the difference between the accumulated current and the predetermined current (step 812). Afterwards, process 800 returns to step 804 in which WL driver 720 applies a WL voltage having the adjusted, i.e., raised or lowered, WL level to WL0, and current accumulator 750 accumulates the currents in BL0-BL3. If the accumulated current equals, or approximately equals, the predetermined current (step 806: Yes), sense amplifiers 730-733 latch the sensed currents respectively flow in BL0-BL3, and transform the sensed currents into data. Uniform decoder 314 decodes the data, and then outputs the data (step 814). After step 814, process 800 ends. After process 800, a similar process may be performed to read data programmed in memory cells coupled to WL1.

Figure 9:
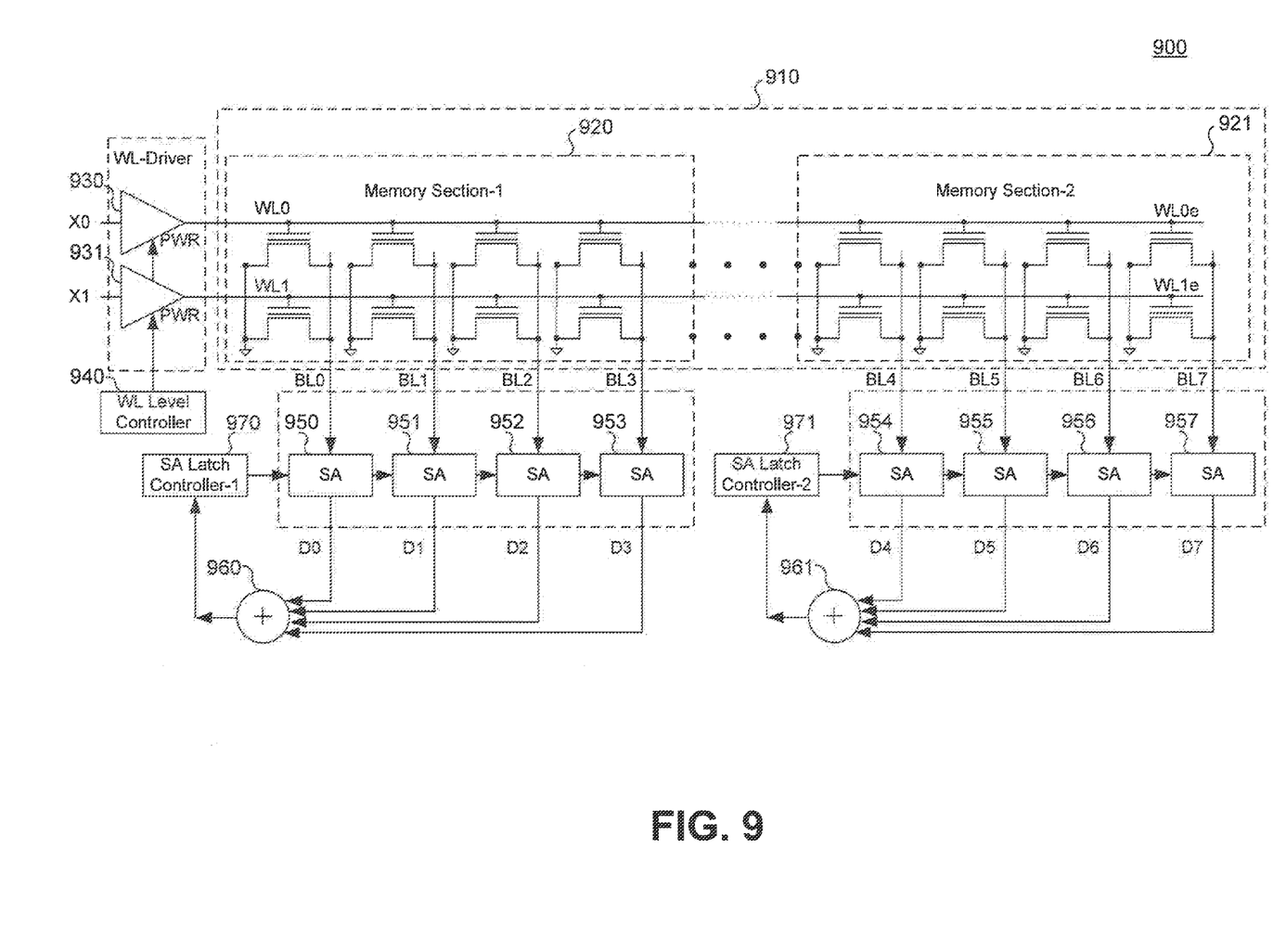
FIG. 9 illustrates a configuration of a read circuit, according to an illustrated embodiment.

In some embodiments, the uniform data element can be utilized to read data programmed in memory cells in multiple memory sections while the word line voltage ramps up during a read operation. FIG. 9 illustrates a configuration of a read circuit 900, according to such an embodiment. Circuit 900 includes a memory array 910 including a plurality of memory cells arranged in rows and columns. Word lines WL0 and WL1 are arranged along the row direction of the memory cells. Bit lines BL0-BL7 arranged along the column direction of the memory cells. The gates of each row of the memory cells are connected to a corresponding one of word lines WL0 and WL1. The drain electrodes of each column of the memory cells are connected to a corresponding one of bit lines BL0-BL7. The source electrode of each memory cell is coupled to a reference voltage level, e.g., the ground level. Memory array 910 is divided into a plurality of memory sections including memory sections 920 and 921. Each memory section 920 or 921 includes a fixed number of columns of memory cells. The fixed number is determined based on the number of bits included in the each of the uniform data units composing the uniform data element. When the uniform data element includes n bits, the fixed number, i.e., the number of columns in each memory section 921 or 922, can be n, or 2n, or 3n, etc. In the embodiment illustrated in FIG. 9, the fixed number is four (4).

Circuit 900 also includes WL drivers 930 and 931, WL level controller 940, sense amplifiers (SAs) 950-957, bit accumulators 960 and 961 respectively corresponding to memory sections 920 and 921, and SA latch controllers 970 and 971 respectively corresponding to memory sections 920 and 921. WL drivers 930 and 931 are operatively coupled to WL0 and WL1 of memory array 910, to respectively supply WL voltages to WL0 and WL1. WL level controller 940 is operatively coupled to WL drivers 930 and 931 to provide WL levels of the WL voltages to be supplied to WL0 and WL1. In the present embodiment, the WL voltages to be supplied to WL0 and WL1 are ramped up from 0 V to a predetermined voltage that is slightly higher than a WL voltage for reading data. Sense amplifiers 950-957 are operatively coupled to BL0-BL7 of memory section 920 and 921, to sense data respectively programmed in the memory cells. Each one of bit accumulators 960 and 961 accumulates the sensed data of the memory cells in the corresponding memory section 920 or 921. That is, bit accumulator 960 is operatively coupled to sense amplifiers 950-953 to accumulate the sensed data D0-D3 of the memory cells in memory section 920. Bit accumulator 961 is operatively coupled to sense amplifiers 954-957 to accumulate the sensed data D4-D7 of the memory cells in memory section 921. SA latch controller 970 is operatively coupled to bit accumulator 960 to receive the data transferred from bit accumulator 960, and to control the latching of the sensed data of sense amplifiers 950-953 when the number of "0"s in the sensed data equals, or approximately equals, the number of "1"s. SA latch controller 971 is operatively coupled to bit accumulator 961 to receive the data transferred from bit accumulator 961, and to control the latching of sense amplifiers 954-957 when the number of "0"s in the sensed data equals, or approximately equals, the number of "1"s.

Figure 10:
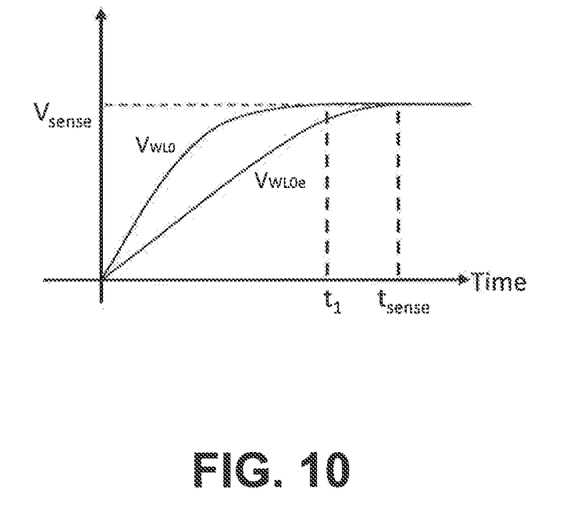
FIG. 10 schematically illustrates a method of reading data, according to a comparative example.

FIG. 10 schematically illustrates a method of reading data, according to a comparative example. When a word line is connected to the gates of many memory cells, the capacitance and the resistance of the word line are very large. As a result, it usually takes a relatively longer time to raise the word line voltage of the entire word line to a desired voltage level $V_{sense}$. For example, as illustrated in FIG. 10, when a voltage $V_{WL0}$ at an end of WL0 near the WL driver reaches $V_{sense}$ at time t1, a voltage $V_{WL0e}$ at a far end of WL0 has not yet reached $V_{sense}$. Voltage $V_{WL0e}$ at the far end of WL0 reaches $V_{sense}$ at time $t_{sense}$, which is greater than time t1. If the memory cells on the entire WL0 are to be read simultaneously at time $t_{sense}$, additional time would be needed for voltage $V_{WL0e}$ at the far end of WL0 to reach $V_{sense}$. Such additional time may increase access time of the memory cells.

Figure 11:
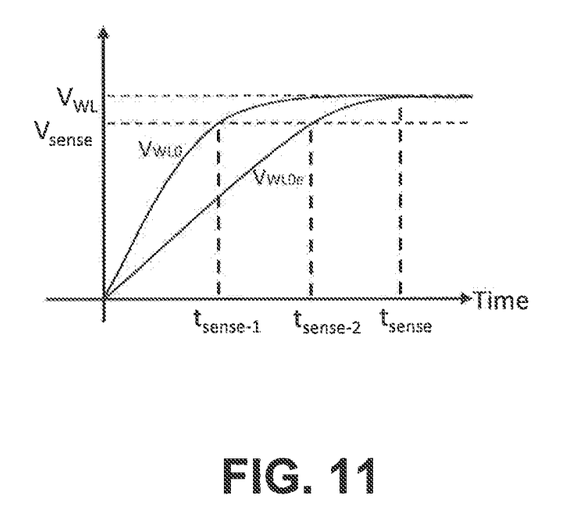
FIG. 11 schematically illustrates a method of reading data in the read circuit of FIG. 9, according to an illustrated embodiment.

In contrast, in the present embodiment, memory array 910 is divided into a plurality of memory sections 920, 921, and the data programmed in the memory cells in each memory section 920 or 921 is read separately based on the data in each memory section 920 or 921. FIG. 11 schematically illustrates a method of reading data in circuit 900, according to an illustrated embodiment. As illustrated in FIG. 11, the word line voltage supplied by WL driver 930 is ramped up from 0 to $V_{WL}$, which is slightly higher than the desired voltage level $V_{sense}$. During the ramping up of the word line voltage, $V_{WL0}$ at the near end of WL0, which corresponds to memory section 920, rises faster than $V_{WL0e}$ at the far end of WL0. As a result, $V_{WL0}$ reaches the desired voltage level $V_{sense}$ at time $t_{sense-1}$, while $V_{WL0e}$ reaches $V_{sense}$ at time $t_{sense-2}$, which is greater than $t_{sense-1}$. SA latch controllers 970 and 971 separately determine whether the corresponding word line voltages reach $V_{sense}$, and latch data of sense amplifiers 950-953 and 954-957 in response to the determination results. The desired voltage $V_{sense}$ is the optimal WL voltage located between curve 110 for data "1" and curve 120 for data "0", as illustrated in FIG. 1. Because the uniform data element is programmed in memory array 910, SA latch controller 970 or 971 senses an equal number of "0"s and "1"s only when $V_{WL0}$ or $V_{WL0e}$ reaches $V_{sense}$. Before $V_{WL0}$ or $V_{WL0e}$ reaches $V_{sense}$, e.g., at a level in the middle of curve 110 as illustrated in FIG. 1, SA latch controller 970 or 971 senses more "0"s than "1"s. That is, when SA latch controller 970 corresponding to memory section 920 determines that the number of "0"s in the data contained in the memory cells of memory section 920 equals, or approximately equals, the number of "1"s at $t_{sense-1}$, SA latch controller 970 determines that voltage $V_{WL0}$ reaches $V_{sense}$ and, as a result, latches data of sense amplifiers 950-953. Similarly, when SA latch controller 971 corresponding to memory section 921 determines that the number of "0"s in the data contained in the memory cells of memory section 921 equals, or approximately equals, the number of "1"s at $t_{sense-2}$, SA latch controller 971 determines that voltage $V_{WL0e}$ reaches $V_{sense}$ and, as a result, latches data of sense amplifiers 954-957. After all of the data of sense amplifiers 950-957 are latched, sense amplifiers 950-957 transfer the latched data to uniform decoder 314, which decodes the data, and outputs the data to an I/O buffer.

In the above described embodiments, the memory cells are single-level cells (SLCs) each storing one-bit data, i.e., "0" or "1". However, the disclosure can be applied to any type of memory cells, such as multi-level cells (MLCs) each storing 2-bit data, or triple-level cells (TLCs) each storing 3-bit data.

Memory arrays 510, 710, and 910 respectively illustrated in FIGS. 5, 7, and 9 of the above described embodiments, are NOR type memory arrays. However, the disclosure can also be implemented in NAND type memory arrays.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A memory system, comprising:
a memory array including a plurality of memory cells; and
an encoder, operatively coupled to the memory array, for encoding an original data element to be programmed into the memory cells into a uniform data element in which the number of "0"s approximately equals the number of "1"s,
wherein the memory array includes a plurality of memory sections each including a fixed number of columns of memory cells,
the memory system further includes:
a plurality of sense amplifiers for sensing data respectively programmed in the memory cells;
a plurality of bit accumulators respectively corresponding to the plurality of memory sections, each bit accumulator accumulating the sensed data of the memory cells in the corresponding memory section; and
a plurality of sense amplifier controllers respectively corresponding to the plurality of memory sections, each sense amplifier controller receiving the accumulated data from a corresponding bit accumulator, and latching data of a corresponding subset of sense amplifiers when the number of "0"s in the accumulated data approximately equal the number of "1"s.

2. The memory system of claim 1, wherein the encoder divides the original data element into a plurality of original data units, and encodes each original data unit into a uniform data unit.

3. The memory system of claim 2, wherein the encoder adds a coding overhead to each original data unit to generate a uniform data unit based on the numbers of "0"s and "1"s in the original data unit.

4. The memory system of claim 2, wherein the encoder encodes the original data units into the uniform data units based on a lookup table which includes mapping relationships between a plurality of original data units and a plurality of uniform data units.

5. The memory system of claim 1, wherein the encoder applies a randomize operation to the original data element to encode the original data element into the uniform data element.

6. A method for operating a memory system, comprising:
receiving an original data element to be programmed into a memory array including a plurality of memory cells;
encoding the original data element into a uniform data element in which the number of "0"s equals or approximately equals the number of "1"s;
programming the uniform data element into the memory cells;
sensing data programmed in a subset of memory cells corresponding to a selected word line during a read operation to generate sensed data;
adjusting a word line (WL) level of the selected word line based on the numbers of "0"s and "1"s in the sensed data;
if the number of "0"s in the sensed data equals the number of "1"s or the difference between the numbers of "0"s and "1"s is within a predetermined error range, latching the sensed data;
if the number of "0"s is less than the number of "1"s and the difference between the numbers of "0"s and "1"s is beyond a predetermined error range, raising the WL level of the selected word line by an amount based on a difference between the number of "1"s and the number of "0"s; and
if the number of "1"s is more than the number of "0"s and the difference between the numbers of "0"s and "1"s is beyond a predetermined error range, lowering the WL level of the selected word line by an amount based on the difference between the number of "1"s and the number of "0"s.

7. The method of claim 6, wherein the encoding the original data into uniform data includes:
dividing the original data element into a plurality of original data units; and
encoding each original data unit into a uniform data unit.

8. The method of claim 7, wherein the encoding each original data unit into a uniform data unit includes adding a coding overhead to the original data unit to generate a uniform data unit based on the numbers of "0"s and "1"s in the original data unit.

9. The method of claim 7, further including encoding each original data unit into a uniform data unit based on a lookup table which includes mapping relationships between a plurality of original data units and a plurality of uniform data units.

10. The method of claim 6, wherein the encoding the original data element into the uniform data element includes applying a randomize operation to the original data element.

11. The method of claim 6, wherein the memory array includes a plurality of memory sections each including a fixed number of columns of memory cells,
the method further including:
sensing data respectively programmed in the memory cells of at least one memory section;
accumulating the sensed data of the memory cells in the at least one memory section to generate accumulated data; and
latching the sensed data when the number of "1"s in the accumulated data equals the number of "0"s or the difference between the numbers of "0"s and "1"s is less than a predetermined error.

12. A method for operating a memory system, the memory system including a memory array including a plurality of memory cells programmed with uniform data in which the number of "0"s equals, or approximately equals, the number of "1"s, the method comprising:
sensing currents respectively flowing through a plurality of bit lines in the memory array during a read operation to generate sensed currents;
adjusting a word line level of a selected word line based on the sensed currents;
if a summation of the sensed currents equals a predetermined current representing a current when the number of "0"s equals the number of "1"s or the difference between the summation of the sensed currents and the predetermined current is within a predetermined error range, latching the sensed data;
if the summation of the sensed currents is lower than the predetermined current and the difference between the summation of the sensed currents and the predetermined current is beyond the predetermined error range, raising a word line (WL) of a selected word line of the memory array by an amount based on a difference between the sensed current and the predetermined current; and
if the summation of the sensed currents is higher than the predetermined current and the difference between the summation of the sensed currents and the predetermined current is beyond the predetermined error range, lowering the WL level of the selected word line by an amount based on the difference between the sensed current and the predetermined current.

* * * * *